April 21, 1970 T. C. NEW ET AL 3,507,714

HIGH CURRENT SINGLE DIFFUSED TRANSISTOR

Filed Aug. 16, 1967

WITNESSES

Edwin E. Bassler

James F. Young

INVENTORS

Thorndike C. New, Paul M. Kisinko, Frederick G. Ernick & Joseph Marino

BY

C. L. Menzemer

ATTORNEY 3,507,714

HIGH CURRENT SINGLE DIFFUSED TRANSISTOR

Thorndike C. New and Paul M. Kisinko, Greensburg, Frederick G. Ernick, Youngwood, and Joseph Marino, Irwin, Pa., assignors to Westinghouse Electric Corporation, Pittsburgh, Pa., a corporation of Pennsylvania Filed Aug. 16, 1967, Ser. No. 661,038
Int. Cl. H01l 7/44, 7/62
U.S. Cl. 148—186 2 Claims

ABSTRACT OF THE DISCLOSURE

This invention is directed to a high current, 200 ampere, single diffused transistor which has a low saturation voltage at high current levels. This necessary parameter for such a device is realized by the device having a low base resistance due to a portion of the base region being highly doped. The invention is also directed to a diffusion process for preparing such a device.

GOVERNMENT CONTRACT

The invention herein described was made in the course of or under a contract or subcontract thereunder with NASA. The contract is JPL contract 951303.

BACKGROUND OF THE INVENTION

This invention is in the field of semiconductor devices and more particularly in the field of power transistors.

In the past it has been believed that the current handling capability of power transistors was directly related only to the effective emitter and collector area and the emitter edge length. This has dictated the use of large bodies of semiconductor material. However, even employing such large area bodies 100 ampere transistors have been the largest current devices produced to date.

It has also been found that higher current devices can be produced by a unique combination and sequence of process steps.

SUMMARY OF THE INVENTION

This invention is directed to a transistor having an emitter region, a base region and a collector region, said base region being disposed between said emitter and said collector regions, a first p-n junction between said emitter region and said base region, a second p-n junction between said base region and said collector region, an electrical contact affixed to each of said regions, the portion of the base region immediately adjacent the p-n junction between said emitter region and said base region and including the portion of the base region to which the electrical contact is affixed having a doping concentration of from $10^{18}$ to $10^{21}$ atoms of dopant per cubic centimeter or semiconductor material, and that portion of the base region immediately adjacent the p-n junction between the base region and the collector region having a doping concentration of from $10^{14}$ to $10^{17}$ atoms of dopant per cubic centimeter of semiconductor material.

The invention is also directed to a process for producing the device consisting sequentially of:

(1) Forming a highly doped, $10^{18}$ to $10^{21}$, region of a first type of semiconductivity in a body of semiconductor material which has the same type of semiconductivity but less highly doped than said region by diffusion through said top and bottom surfaces of said body, (2) Removing the region formed by diffusion through said bottom surface, (3) Driving the remaining region deeper into said body, (4) Forming a highly doped $10^{18}$ to $10^{21}$, region of a second type of semiconductivity at the top and bottom of said body by diffusing through the top and bottom surface of said body, the region formed by diffusion through the top surface of the body being more shallow than the region of first type semiconductivity formed by diffusion through the top surface of the body.

(5) Etching away the central portion of the region of second-type of semiconductivity formed by diffusion through the top surface, (6) Driving both the regions of first-type and second-type of semiconductivity formed by diffusion through the top surface of the body and the region of second-type semiconductivity formed by diffusion through the bottom surface of the body deeper into said body, and (7) Affixing metal contacts to the three regions.

BRIEF DESCRIPTION OF THE DRAWING

For a better understanding of the nature of this invention reference should be had to the following detailed description and drawing of which.

DESCRIPTION OF THE PREFERRED EMBODIMENT

Figures 1, 2, 3, 4, 5, 6, 7, 8:
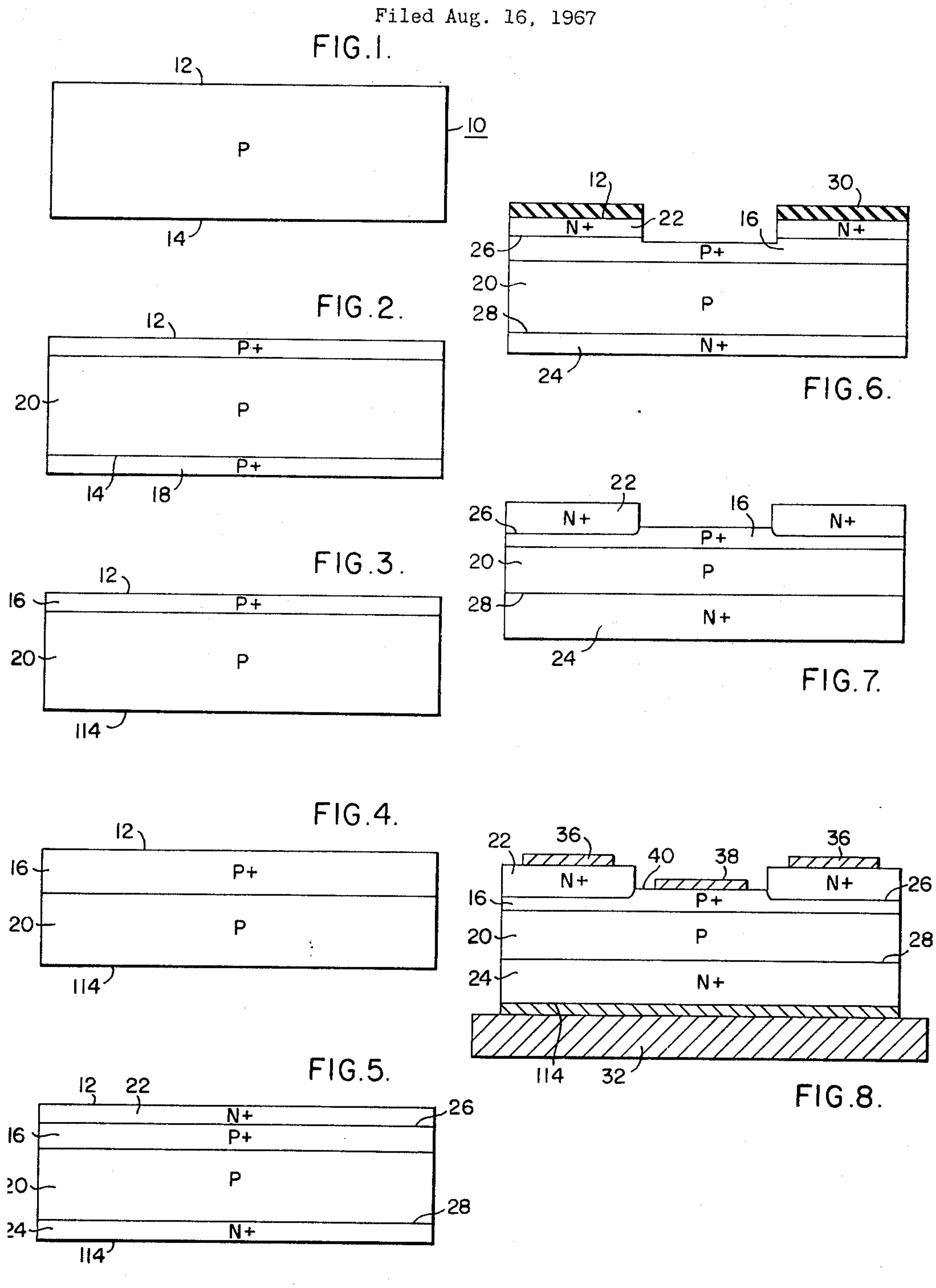
FIGURE 1 is a side view of a body semiconductor material suitable for use in accordance with the teachings of this invention.
FIGS. 2 to 7 are side views, in section, of the body of FIG. 1 being processed in accordance with the teaching of this invention.
FIG. 8 is a transistor prepared in accordance with the teachings of this invention.

With reference to FIG. 1, there is shown a body 10 of semiconductor material suitable for use in accordance with the teachings of this invention. The body 10 has a top surface 12 and a bottom surface 14.

The body 10 may be comprised of any semiconductor material known to those skilled in the art, as for example silicon, germanium, silicon carbide, stoichiometric compounds of a Group III and a Group V element, and stoichiometric compounds of a Group II and a Group VI element.

The semiconductor material comprising the body 10 may have either an n- or p-type semiconductivity as a result of having been doped to a concentration of from $10^{14}$ to $10^{17}$ atoms of dopant per cubic centimeter of semiconductor material.

For the purposes of explanation, it will be considered that body 10 is comprised of p-type silicon doped to a concentration of from $10^{14}$ to $10^{17}$ atoms of dopant per cubic centimeter of silicon.

With reference to FIG. 2, the body 10 is disposed in a diffusion furnace and p-type regions 16 and 18 are formed in the body 10 by the diffusion of a p-type dopant as for example boron from a boron bromide source, through the top surface 12 and bottom surface 14 of the body 10.

The regions 16 and 18 are doped to a concentration of from $10^{18}$ to $10^{21}$ atoms of boron per cubic centimeter of silicon.

The body 10 now consists of p+ regions 16 and 18 and p-region 20.

For purposes of explanation a region denoted as a plus (+) region will be considered to be one doped to a concentration of from $10^{18}$ to $10^{21}$, while a doped region not denoted as a plus region will be considered to be one having a doping concentration of from $10^{14}$ to $10^{17}$ atoms of dopant per cubic centimeter of silicon.

With reference to FIG. 3, the p+ region 18 is removed from the body 10 by abraiding or chemical etching or a combination of the two. The body 10 now has a new bottom surface 114.

With reference to FIG. 4, the body 10 is then disposed in a furnace and p+ region 16 is driven deeper into the body 10 by solid state diffusion. This is accomplished by heating the body 10 for about 16 hours at 1200° C.

If the original body 10 had an original thickness of about 5 to 6.5 mils, satisfactory results have been realized when the p+ region 16 is driven into the body 10 to a depth of about 1.5 mils by solid state diffusion.

With reference to FIG. 5, the body 10 is disposed in a diffusion furnace and n+ regions 22 and 24 are formed in the body 10 by the diffusion of an n-type dopant, as for example phosphorus, through the top surface 12 and layer 38 is the base contact, and 32 is the collector contact.

The affixing of the base contact 38 to p+ region 16 rather than to a mere p-region, such as region 20, reduces the base resistance ($r_{bb'}$), that is the resistance between the base contact and the base region, and provides a device having a low saturation voltage at high current levels.

Two transistors prepared in accordance with the teachings of this invention were tested and their electrical properties are set forth below.

| | $V_{CBO}/I_{CBO}$ v./ma. | $V_{CEO}/I_{CEO}$ v./ma. | $V_{EBO}/I_{EBO}$ v./ma. | $h_{fe}$ $V_{CE}$=3 v. $I_C$=.5 a. | $h_{fe}$ $V_{CE}$ 4 v. $I_C$=75 a. | $h_{fe}$ $V_{CE}$=4 v. $I_C$ 100 a. | $V_{CE}$ (sat.) 75 a. volts | $h_{fe}$ 200 a. 5 v. | $V_{CEO}$ (SUS) volts/ma. | Switching speed µs |
|---|---|---|---|---|---|---|---|---|---|---|
| 1 | 140/10 | 120/30 | 4/1 | 35 | 50 | 30 | .7 | 20 | 100/500 | <15 |
| 2 | 65/10 | 50/50 | 4/1 | 35 | 35 | 33 | .8 | 17 | 50/100 | <15 |

the bottom surface 114 of the body. The regions 22 and 24 are doped to a concentration of from $10^{18}$ to $10^{21}$ atoms of phosphorus per atom of silicon. The regions 22 and 24 have a depth of about .2 to .3 mil. The n+ region 22 does not diffuse completely through p+ region 16 to p-region 20.

There is a p-n junction 26 between n+ region 22 and p+ region 16 and a p-n junction 28 between n+ region 24 and p-region 20.

With reference to FIG. 6, a layer 30 of a suitable photoresist is disposed over the outer periphery of the top surface 12 of the body 10 and the central portion of n+ region 22 is completely etched away. The etching is carried out to a depth of about 0.6 mil to ensure completely etching away the unprotected portion of n+ region 22 and that portion p-n junction 26 immediately below the etched away portion of n+ region 22.

A suitable etchant is one consisting of, all parts by weight, 15 parts nitric acid, 5 parts acetic acid and 3 parts hydrofluoric acid.

With reference to FIG. 7, the body 10 is then disposed in a furnace and heated at about 1250° C. for a time sufficient to drive the n+ regions 22 and 24 into the body 10 to a depth of from 0.4 to 2 mils and preferably about 0.5 mil.

It will be understood of course that the driving in of the n+ regions 22 and 24 by solid state diffusion also drives p+ region 16 deeper into p-region 20.

It will be understood also that the exact depth to which the various regions are driven in depends on the thickness of the body 10 and to a degree on the electrical properties desired in the final device.

With reference to FIG. 8, a base contact 32, consisting of a material selected from the group consisting of molybdenum, tungsten, tantalum and base alloys thereof is soldered to bottom 114 of the body 10 by a solder layer 34.

The solder layer 34 is preferably a solder known to those skilled in the art as a hard solder and having a melting point above 375° or it may be of a soft solder and have a melting point below 375° C.

A first layer 36 of aluminum is evaporated onto the top surface of n+ region 22 and a second layer 38 of aluminum is evaporated onto top surface 40 of p+ region 16 exposed between regions 22. The aluminum layers form ohmic contacts with the regions and have a thickness of about 30,000 A.

The device of FIG. 8 is a transistor. n+ region 22 is the emitter, p+ region 16 and p-region 20 together are the base and n+ region 24 is the collector.

Aluminum layer 36 is the emitter contact, aluminum

While the invention has been described with reference to particular embodiments and examples, it will be understood, of course, that modifications, substitutions and the like may be made therein without departing from its scope.

We claim as our invention:

1. A process for preparing a semiconductor device consisting sequentially of;

(1) forming a more highly doped region of a first type of semiconductivity in a body of semiconductor material having said first type of semiconductivity by diffusing a doping impurity through top and bottom surfaces of said body, (2) removing the region formed by diffusion through the bottom surface, (3) driving the remaining region deeper into said body by solid state diffusion, (4) thereafter forming a region of a second type of semiconductivity having a doping concentration of from $10^{18}$ to $10^{21}$ atoms of dopant per cubic centimeter of semiconductor material by diffusing a suitable dopant through the top and bottom surfaces of the body, the region formed by diffusing through the top surface of the body being more shallow than the region of first-type of semiconductivity formed by diffusion through top surface of the body, (5) etching away completely the central portion of the region of second-type of semiconductivity formed by diffusion through the top surface, (6) driving all of the regions deeper into said body, and (7) affixing metal electrical contacts to the three regions.

2. The process of claim 1 in which the metal electrical contacts are affixed to the two regions formed by diffusion through the top surface by evaporating aluminum onto the top surfaces of the two regions.

References Cited

UNITED STATES PATENTS

| | | | |
|---|---|---|---|
| 3,041,509 | 6/1962 | Belmont et al. | 317—235 |
| 3,275,910 | 9/1966 | Phillips | 317—235 |
| 3,327,181 | 6/1967 | Williams | 317—235 |

FOREIGN PATENTS

| | | |
|---|---|---|
| 569,807 | 8/1958 | Belgium. |

L. DEWAYNE RUTLEDGE, Primary Examiner

R. A. LESTER, Assistant Examiner

U.S. Cl. X.R.

148—188, 190